United States Patent
Lee et al.

(10) Patent No.: US 9,876,161 B2
(45) Date of Patent: Jan. 23, 2018

(54) METHOD OF FABRICATING PIEZOELECTRIC ENERGY HARVESTING DEVICE

(71) Applicant: Electronics and Telecommunications Research Institute, Daejeon (KR)

(72) Inventors: Sang Kyun Lee, Gwangju (KR); Yil Suk Yang, Daejeon (KR); Jong-Kee Kwon, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/159,903

(22) Filed: May 20, 2016

(65) Prior Publication Data

US 2016/0268495 A1   Sep. 15, 2016

Related U.S. Application Data

(62) Division of application No. 13/908,086, filed on Jun. 3, 2013, now Pat. No. 9,379,309.

(30) Foreign Application Priority Data

Dec. 6, 2012   (KR) .......................... 10-2012-0141161

(51) Int. Cl.
| | |
|---|---|
| H01L 41/312 | (2013.01) |
| H01L 41/187 | (2006.01) |
| H01L 41/047 | (2006.01) |
| H01L 41/338 | (2013.01) |
| H01L 41/335 | (2013.01) |

(Continued)

(52) U.S. Cl.
CPC ........ *H01L 41/312* (2013.01); *H01L 41/0475* (2013.01); *H01L 41/113* (2013.01); *H01L 41/183* (2013.01); *H01L 41/187* (2013.01); *H01L 41/1876* (2013.01); *H01L 41/335* (2013.01); *H01L 41/338* (2013.01);
(Continued)

(58) Field of Classification Search
CPC . H01L 41/0475; H01L 41/113; H01L 41/183; H01L 41/187; H01L 41/1876; H01L 41/312; H01L 41/37; H01L 41/335; H01L 41/338; H01L 41/45; Y10T 29/42
See application file for complete search history.

(56) References Cited

U.S. PATENT DOCUMENTS

| | | | |
|---|---|---|---|
| 4,826,616 A * | 5/1989 | Tanino | ..................... H01L 41/37 252/62.9 R |
| 5,539,965 A | 7/1996 | Safari et al. | |

(Continued)

FOREIGN PATENT DOCUMENTS

JP   2003070096 A * 3/2003

*Primary Examiner* — A. Dexter Tugbang
(74) *Attorney, Agent, or Firm* — Rabin & Berdo, P.C.

(57) ABSTRACT

A method of fabricating a flexible piezoelectric energy harvesting device is provided. The method includes forming a piezoelectric layer to include a plurality of first piezoelectric lines spaced apart from each other in one direction and a plurality of second piezoelectric lines respectively filling spaces between the first piezoelectric lines, then placing the piezoelectric layer on a first flexible electrode substrate to come in direct contact with the first flexible electrode, and forming a second flexible electrode substrate on the piezoelectric layer.

14 Claims, 7 Drawing Sheets

(51) Int. Cl.
   *H01L 41/45*    (2013.01)
   *H01L 41/37*    (2013.01)
   *H01L 41/113*   (2006.01)
   *H01L 41/18*    (2006.01)

(52) U.S. Cl.
   CPC .............. *H01L 41/37* (2013.01); *H01L 41/45* (2013.01); *Y10T 29/42* (2015.01)

(56) References Cited

U.S. PATENT DOCUMENTS

| | | |
|---|---|---|
| 5,625,149 A | 4/1997 | Gururaja et al. |
| 5,998,910 A * | 12/1999 | Park .................... H01L 41/183 |
| | | 252/62.9 PZ |
| 7,197,798 B2 | 4/2007 | Wilkie et al. |
| 2011/0000060 A1 | 1/2011 | Lee et al. |

\* cited by examiner

METHOD OF FABRICATING PIEZOELECTRIC ENERGY HARVESTING DEVICE

CROSS-REFERENCE TO RELATED APPLICATIONS

This is a division of application Ser. No. 13/908,086, filed Jun. 3, 2013. Further, this U.S. non-provisional patent application claims priority under 35 U.S.C. § 119 to Korean Patent Application No. 10-2012-0141161, filed on Dec. 6, 2012, The disclosures of these prior US and Korean applications are incorporated herein by reference.

BACKGROUND

The inventive concept relates to piezoelectric energy harvesting devices and methods of fabricating the same and, more particularly, to flexible piezoelectric energy harvesting devices using piezoelectric lines or piezoelectric islands and methods of fabricating the same.

An energy harvesting technique converts wasted environmental energy into electrical energy to improve the energy efficiency of electronic products or electronic devices. Ultimately, the energy harvesting technique may enable stand-alone operation and/or self-charging of the electronic products or devices by using the environmental energy without additional supply of electrical energy.

If mechanical energy is applied to a piezoelectric material, the piezoelectric material generates electrical energy. Thus, an energy harvesting technique using the piezoelectric material converts the mechanical energy (e.g., force, pressure, and/or vibration) wasted in the circumference into the electrical energy available to us.

The energy harvesting technique using the piezoelectric material may use environmental energy sources such as the vibration of motors/pumps, human movement, the flow of water, and/or a wind to generate the electrical energy in a dark place without sunlight and/or at night.

However, a piezoelectric ceramic material used as piezoelectric material may have brittle and/or rigid properties. Thus, the piezoelectric ceramic material may be difficult to be applied to a device having a predetermined shape. Additionally, the piezoelectric ceramic material may have poor durability under shock or impulse.

Generally, a piezoelectric energy harvesting (PEH) device may include a piezoelectric wafer and a non-piezoelectric layer. The piezoelectric wafer may generate the electrical energy by vibration, pressure, sound, and/or deformation. The non-piezoelectric layer may be provided to supplement the brittle property of the piezoelectric material. The non-piezoelectric layer may include silicon, aluminum, copper, and/or a printed circuit board (PCB), etc. However, the combined structure of the piezoelectric material and the non-piezoelectric layer may have hardness, such that it may not be easily applied to application fields (e.g., the human body and/or clothes) requiring flexible properties.

A piezoelectric polymer has been suggested for resolving the above problems. However, the piezoelectric characteristics of the piezoelectric polymer may be very lower than that of the piezoelectric ceramic. Thus, the piezoelectric polymer may generate a low power of a few micro watt levels.

SUMMARY

Embodiments of the inventive concept may provide flexible piezoelectric energy harvesting devices capable of improving stability and the amount of generated electrical energy.

Embodiments of the inventive concept may provide methods of fabricating a flexible piezoelectric energy harvesting device capable of improving stability and the amount of generated electrical energy.

In one aspect, a flexible piezoelectric energy harvesting device may include: a first flexible electrode substrate; a piezoelectric layer disposed on the first flexible electrode substrate, the piezoelectric layer including a plurality of first piezoelectric lines spaced apart from each other in one direction and a plurality of second piezoelectric lines respectively filling spaces between the first piezoelectric lines; and a second flexible electrode substrate disposed on the piezoelectric layer.

In an embodiment, the first and second flexible electrode substrates may include a conductive material.

In an embodiment, each of the first and second flexible electrode substrates may include: an insulating polymer layer; and an electrode pattern disposed on a surface of the insulating polymer layer which is adjacent to the piezoelectric layer.

In an embodiment, the electrode pattern may have an interdigitated electrode (IDE) structure.

In an embodiment, the first piezoelectric lines may include a piezoelectric ceramic material or a single-crystalline material.

In an embodiment, the first piezoelectric lines may include the piezoelectric ceramic material; and the piezoelectric ceramic material may include lead zirconate titanate (PZT) or lead-free ceramic materials.

In an embodiment, the first piezoelectric lines may include the single-crystalline material; and the single-crystalline material may include lead magnesium niobate-lead titanate (PMN-PT), lead magnesium niobate-lead zirconate titanate (PMN-PZT), lead indium niobate-lead titanate (PIN-PT), or lead zirconate niobate-lead titanate (PZN-PT).

In an embodiment, the second piezoelectric lines may include a piezoelectric polymer material; and the piezoelectric polymer material may include a polyvinylidene difluoride (PVDF) polymer-based piezoelectric material, or a polyvinylidene difluoride-trifluoroethylene (PVDF-TrFE) polymer-based piezoelectric material.

In an embodiment, each of the first and second piezoelectric lines may have a quadrilateral cross section in another direction crossing the one direction.

In another aspect, a flexible piezoelectric energy harvesting device may include: a first flexible electrode substrate; a piezoelectric layer disposed on the first flexible electrode substrate, the piezoelectric layer including a plurality of piezoelectric islands spaced apart from each other and regularly arranged and a piezoelectric net pattern filling spaces between the piezoelectric islands; and a second flexible electrode substrate disposed on the piezoelectric layer.

In still another aspect, a method of fabricating a flexible piezoelectric energy harvesting device may include: forming a piezoelectric layer on a first flexible electrode substrate, the piezoelectric layer including a plurality of first piezoelectric lines spaced apart from each other in one direction and a plurality of second piezoelectric lines respectively filling spaces between the first piezoelectric lines; and forming a second flexible electrode substrate on the piezoelectric layer.

In an embodiment, the first and second flexible electrode substrates may include a conductive material.

In an embodiment, each of the first and second flexible electrode substrates may include: an insulating polymer layer; and an electrode pattern disposed on a surface of the insulating polymer layer which is adjacent to the piezoelectric layer. The electrode pattern may have an interdigitated electrode (IDE) structure.

In an embodiment, forming the piezoelectric layer may include: forming a first piezoelectric layer on a sacrificial substrate; patterning the first piezoelectric layer to form the first piezoelectric lines spaced apart from each other in the one direction; forming the second piezoelectric lines filling the spaces between the first piezoelectric lines, respectively; and moving the piezoelectric layer including the first and second piezoelectric lines disposed on the sacrificial substrate onto the first flexible electrode substrate.

In an embodiment, the first piezoelectric layer may be formed of a piezoelectric ceramic material or a single-crystalline material.

In an embodiment, the piezoelectric ceramic material may include lead zirconate titanate (PZT) or lead-free ceramic materials.

In an embodiment, the single-crystalline material may include lead magnesium niobate-lead titanate (PMN-PT), lead magnesium niobate-lead zirconate titanate (PMN-PZT), lead indium niobate-lead titanate (PIN-PT), or lead zirconate niobate-lead titanate (PZN-PT).

In an embodiment, each of the first piezoelectric lines may be formed to have a quadrilateral cross section in another direction crossing the one direction.

In an embodiment, the second piezoelectric lines may be formed of a piezoelectric polymer material; and the piezoelectric polymer material may include a polyvinylidene difluoride (PVDF) polymer-based piezoelectric material, or a polyvinylidene difluoride-trifluoroethylene (PVDF-TrFE) polymer-based piezoelectric material.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
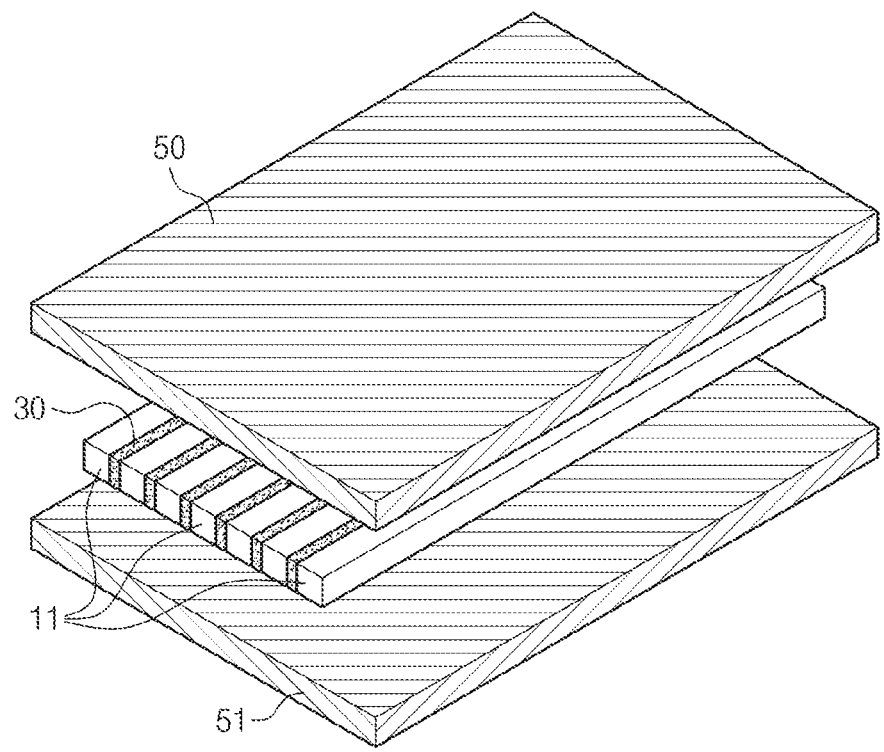
FIG. 1 is a perspective view illustrating a flexible piezoelectric energy harvesting device according to some embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

To solve conventional problems, piezoelectric fiber composites (PFCs) have been developed. The piezoelectric fiber composites includes an active-fiber composite (AFC) and a macro-fiber composite (MFC).

The active-fiber composite includes a piezoelectric ceramic fiber which is roundly extruded; and a resin (e.g., an epoxy) surrounding the piezoelectric ceramic fiber. The resin of the active-fiber composite prevents the piezoelectric ceramic fiber from being broken and provides flexibility to the piezoelectric ceramic fiber.

An electrode of a flexible piezoelectric energy harvesting device has a interdigitated electrode (IDE) shape. The interdigitated electrode may generate an electric field substantially parallel to a fiber polarization direction of the piezoelectric fiber composite or may cause modification. The piezoelectric device including the electrode of the interdigitated electrode shape uses a strong piezoelectric charge coefficient ($d_{33}$) of the piezoelectric ceramic, so as to be used as an actuator or an oscillation attenuator of an apparatus.

However, due to the active-fiber composite of the round shape, suitable bonding of the interdigitated electrode may not be easy and a contact area may be small. Thus, if the active-fiber composite is in the actuator, the actuator may require a voltage greater than a voltage calculated for obtaining a variation amount of the actuator. Additionally, a fabricating process of the active-fiber composite may be difficult, and reproducibility of the active-fiber composite may be reduced. Furthermore, a fabrication cost of the active-fiber composite may increase.

For solving the problems of the active-fiber composite, the macro-fiber composites have been developed in National aeronautics and space administration (NASA). Similarly to the active-fiber composite, the macro-fiber composite includes piezoelectric ceramic fibers, a resin injected therebetween, and two electrode arrays of the interdigitated electrode shape. The piezoelectric ceramic fibers and the resin are disposed between the two electrode arrays.

However, unlike the active-fiber composite having the piezoelectric fiber of the round shape, the piezoelectric fiber of the macro-fiber composite has a quadrilateral cross section, and a uniform space exists between the piezoelectric fibers of the macro-fiber composite. The piezoelectric fibers are accurately arranged in parallel to each other in a macro-fiber composite package.

A fabricating process of the macro-fiber composite is simpler than that of the active-fiber composite. Thus, a fabricating cost of the macro-fiber composite is reduced. The piezoelectric fiber having the quadrilateral cross section may use a raw material formed in a fabricating process of the piezoelectric ceramic. In other words, the piezoelectric ceramic may be divided into small sized piezoelectric fibers by a repeated and cheap fabricating process (e.g., a cutting process using a dicing saw or laser). Thus, mass-production of the piezoelectric fibers may be realized and the piezoelectric fibers may be effectively produced in costs.

Additionally, the piezoelectric fibers of the macro-fiber composite have the quadrilateral cross sections, such that they may become easily in contact with the interdigitated electrode. Moreover, an electric field generated from the interdigitated electrode may decrease by the resin having a low dielectric constant. The piezoelectric charge coefficient of the macro-fiber composite may be improved to about 150% of the piezoelectric charge coefficient of the active-fiber composite for the improved electrical contact of the piezoelectric fiber and the interdigitated electrode.

However, since the piezoelectric fiber composites such as the active-fiber composite and the macro-fiber composite use the resin between the piezoelectric fibers, while the flexibility of the piezoelectric fiber composites increases, electrical output of the piezoelectric fiber composites may be reduced. Additionally, since the piezoelectric fiber composites are fabricated under vacuum, their fabricating costs may increase. For resolving the problems, embodiments of the inventive concept will provide the following flexible piezoelectric energy harvesting devices and methods of fabricating the same.

FIG. 1 is a perspective view illustrating a flexible piezoelectric energy harvesting device according to some embodiments of the inventive concept.

Referring to FIG. 1, a flexible piezoelectric energy harvesting device may include a lower flexible electrode substrate 51, a piezoelectric layer disposed on the lower flexible electrode substrate 51, and an upper flexible electrode substrate 50 disposed on the piezoelectric layer. The piezoelectric layer may consist of a plurality of first piezoelectric lines 11 spaced apart from each other in one direction and a plurality of second piezoelectric lines 30 respectively filling spaces between the first piezoelectric lines 11. In other words, the first piezoelectric lines 11 and the second piezoelectric lines 30 may be alternately and repeatedly arranged in the one direction.

The upper and lower flexible electrode substrates 50 and 51 may include a conductive material such as aluminum (Al), copper (Cu), silver (Ag), and/or gold (Au). In other words, each of the upper and lower flexible electrode substrates 50 and 51 may be a flexible metal substrate. That is, the metal substrate may have a thickness capable of providing the flexibility to the metal substrate. Alternatively, each of the upper and lower flexible electrode substrates 50 and 51 may consist of an insulating polymer layer and a metal sheet disposed on one surface of the insulating polymer layer. The metal sheet may have a thickness capable of providing the flexibility to the metal sheet. An epoxy or a conductive film having adhesive property may be disposed between the metal sheet and the one surface of the insulating polymer layer. In other words, the metal sheet may be bonded to the one surface of the insulating polymer layer by the epoxy or conductive film. In still another embodiment, each of the upper and lower flexible electrode substrates 50 and 51 may consist of the insulating polymer layer and an electrode layer formed on the insulating polymer layer by a screen printing method using a silver paste. In this case, the electrode layer has a thickness capable of providing the flexibility to the electrode layer.

The upper and lower flexible electrode substrates 50 and 51 may be in direct contact with the piezoelectric layer. In other words, the upper and lower flexible electrode substrates 50 and 51 may be in direct contact with the first and second piezoelectric lines 11 and 30. Here, each of the first and second piezoelectric lines 11 and 30 may have a quadrilateral cross section in an extending direction of each of the first and second piezoelectric lines 11 and 30. Thus, electrical contact between the piezoelectric layer and the upper and lower flexible electrode substrates 50 and 51 may be improved to increase the piezoelectric charge coefficient of the flexible piezoelectric energy harvesting device.

The first piezoelectric lines 11 may include a piezoelectric ceramic material or a single-crystalline material. The piezoelectric ceramic material may include lead zirconate titanate (PZT) or lead-free ceramic materials. The single-crystalline material may include lead magnesium niobate-lead titanate (PMN-PT), lead magnesium niobate-lead zirconate titanate (PMN-PZT), lead indium niobate-lead titanate (PIN-PT), or lead zirconate niobate-lead titanate (PZN-PT).

The second piezoelectric lines 30 may include a piezoelectric polymer material. The piezoelectric polymer material may include a polyvinylidene difluoride (PVDF) polymer-based piezoelectric material, or a polyvinylidene difluoride-trifluoroethylene (PVDF-TrFE) polymer-based piezoelectric material.

As a result, the flexible piezoelectric energy harvesting device includes the piezoelectric layer consisting of the first and second piezoelectric lines 11 and 30 having the quadrilateral cross sections in the extending direction of the first and second piezoelectric lines 11 and 30. Thus, the flexible piezoelectric energy harvesting device may have high flexibility and the improved piezoelectric charge coefficient. As a result, it is possible to greatly improve the amount of electrical energy obtained by the flexible piezoelectric energy harvesting device.

FIGS. 2A to 2F are perspective views illustrating a method of fabricating a flexible piezoelectric energy harvesting device according to embodiments of the inventive concept.

Figure 2A:
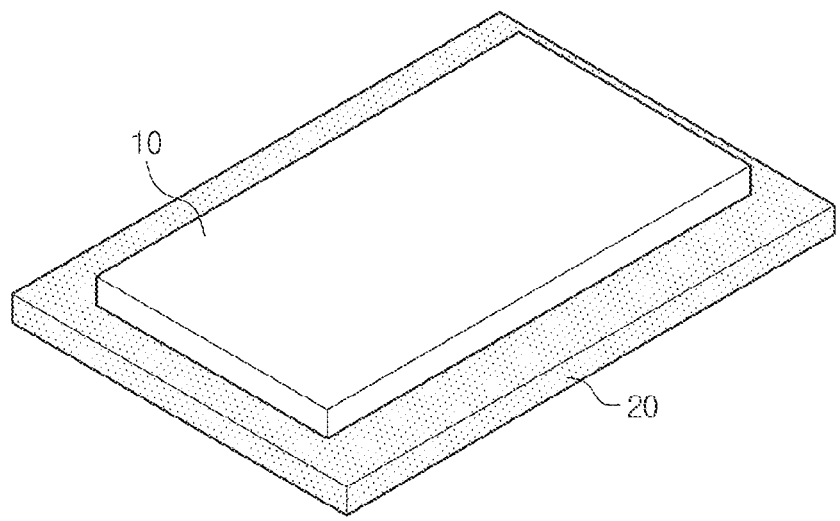
FIGS. 2A to 2F are perspective views illustrating a method of fabricating a flexible piezoelectric energy harvesting device according to embodiments of the inventive concept.

Referring to FIG. 2A, a first piezoelectric layer 10 is formed on a sacrificial substrate 20. The sacrificial substrate 20 may include a non-conductive material. The non-conductive material may be a polymer. For example, the sacrificial substrate 20 may include poly(ethylene terephthalate), poly(butylenes terephthalate), polyimide, polyester, and/or poly olefine (polyethylene, polypropylene). In other words, polymer film may be used as the sacrificial substrate 20. Additionally, the sacrificial substrate 20 may have a little adhesive property. Alternatively, an adhesive layer (not shown) may be disposed between the sacrificial substrate 20 and the first piezoelectric layer 10.

The first piezoelectric layer 10 may include a piezoelectric ceramic material or a single-crystalline material. The piezoelectric ceramic material may include lead zirconate titanate (PZT) or lead-free ceramic materials. The single-crystalline material may include lead magnesium niobate-lead titanate (PMN-PT), lead magnesium niobate-lead zirconate titanate (PMN-PZT), lead indium niobate-lead titanate (PIN-PT), or lead zirconate niobate-lead titanate (PZN-PT).

Figure 2B:
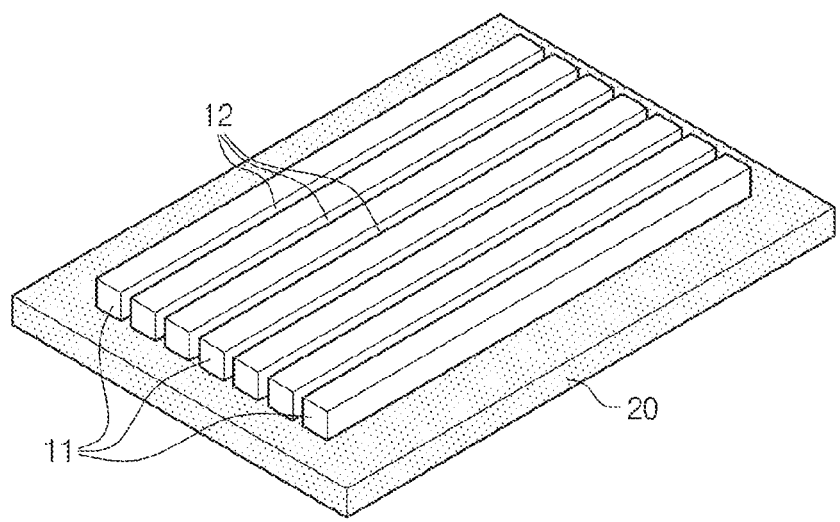

Referring to FIG. 2B, the first piezoelectric layer 10 is patterned to form first piezoelectric lines 11 extending in a first direction and slits 12 between the first piezoelectric lines 11. The first piezoelectric layer 10 may be patterned by a cutting process using an accurately controlled dicing saw or laser. During the cutting process, the sacrificial substrate 20 is not cut but the first piezoelectric layer 10 is completely cut to form the first piezoelectric lines 11 separated from each other. Thus, each of the first piezoelectric lines 11 may have a quadrilateral cross section in the extending direction of the first piezoelectric 11. Additionally, lengths of the first piezoelectric lines 11 may be substantially equal to each other and widths of the first piezoelectric lines 11 may be substantially equal to each other. Each of the slits 12 between the first piezoelectric lines 11 may have a minimum width realized by the cutting process.

Figure 2C:
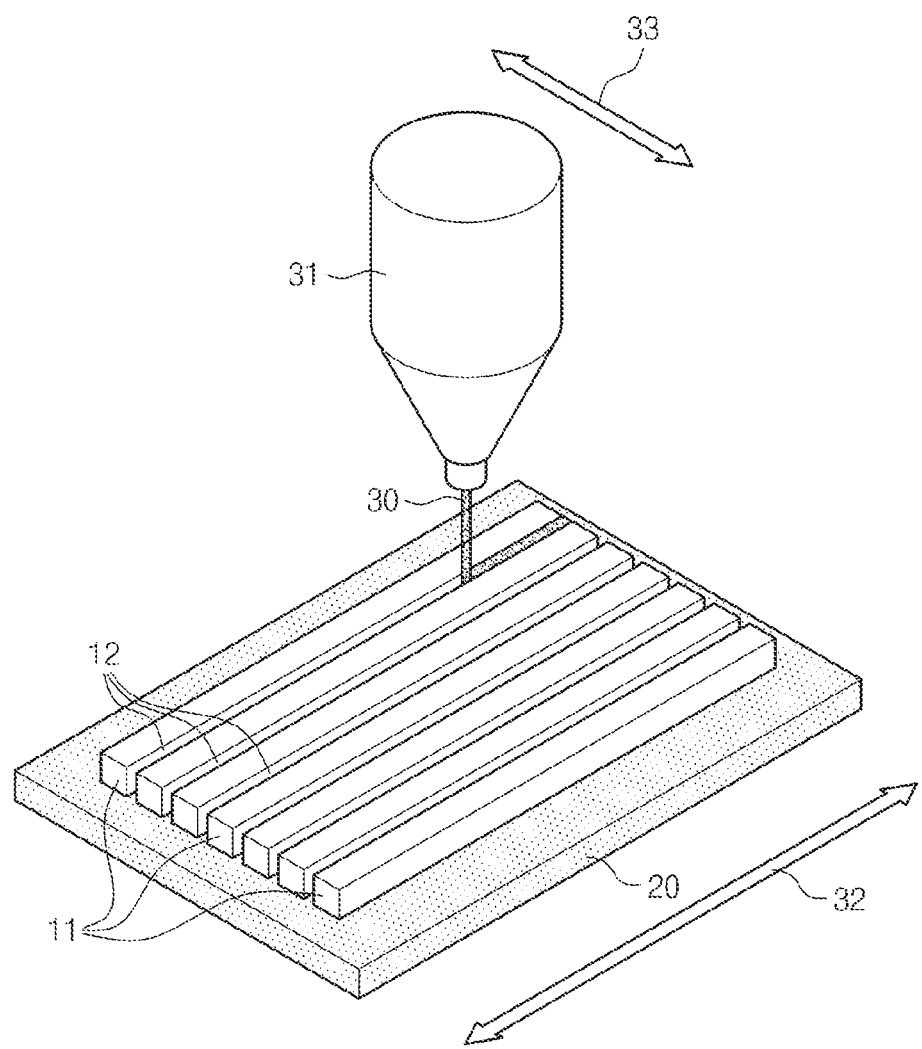
Figure 2D:
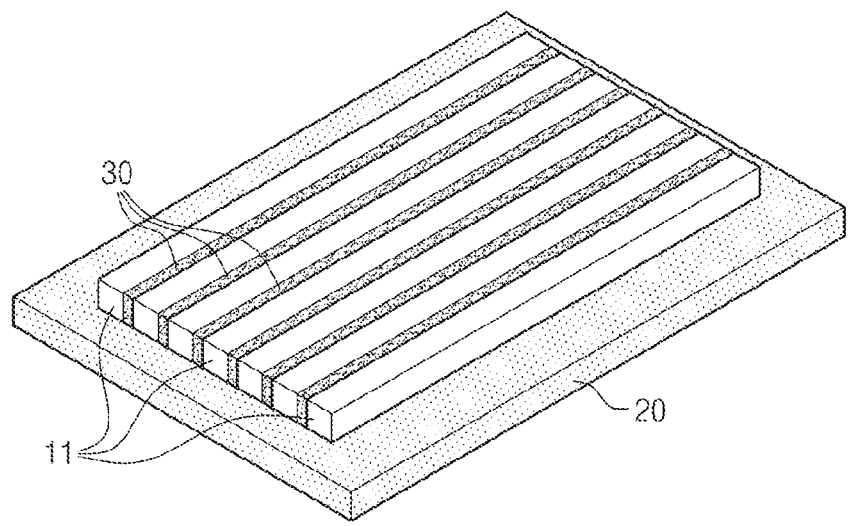

Referring to FIGS. 2C and 2D, second piezoelectric lines 30 are formed to fill the slits 12, respectively. The slits 12 correspond to spaces between the first piezoelectric lines 11 spaced apart from each other in a second direction crossing the extending direction (i.e., the first direction) of the first piezoelectric lines 11. As a result, a piezoelectric layer may be formed to consist of the first piezoelectric lines 11 and the second piezoelectric lines 30 filling the slits 12 corresponding to the spaces between the first piezoelectric lines 11.

The second piezoelectric lines 30 may be formed of a piezoelectric polymer material. The piezoelectric polymer material may include a polyvinylidene difluoride (PVDF) polymer-based piezoelectric material, or a polyvinylidene difluoride-trifluoroethylene (PVDF-TrFE) polymer-based piezoelectric material.

Forming the second piezoelectric lines 30 may include filling the slits 12 with a liquid piezoelectric polymer material 30 exhausted through a needle of a taylor cone 31 containing the liquid piezoelectric polymer material 30. At this time, the sacrificial substrate 20 and the taylor cone 31 may be accurately moved along moving directions 32 and 33 by a motion controller, respectively. The liquid piezoelectric polymer material 30 exhausted through the needle of the taylor cone 31 may fill the slits 12 by the movement of the taylor cone 31 and the sacrificial substrate 20. At this time, the liquid piezoelectric polymer material 30 may be stretched to fill the slits 12. In other words, a diameter of the needle of the taylor cone 31 may be determined depending on the width of the slits 12, such that the liquid piezoelectric polymer material 30 may completely fill the slits 12 between the first piezoelectric lines 11 spaced apart from the second direction.

Since the first piezoelectric lines 11 have the quadrilateral cross section in the extending direction of the first piezoelectric line 11, the second piezoelectric lines 30 filling the slits 12 (i.e., the spaces) between the first piezoelectric lines 11 may also have quadrilateral cross sections in the extending direction. Thus, electrical contact of the piezoelectric layer and flexible electrode substrates 50 and 51 of FIG. 2F may be improved.

Figure 2E:
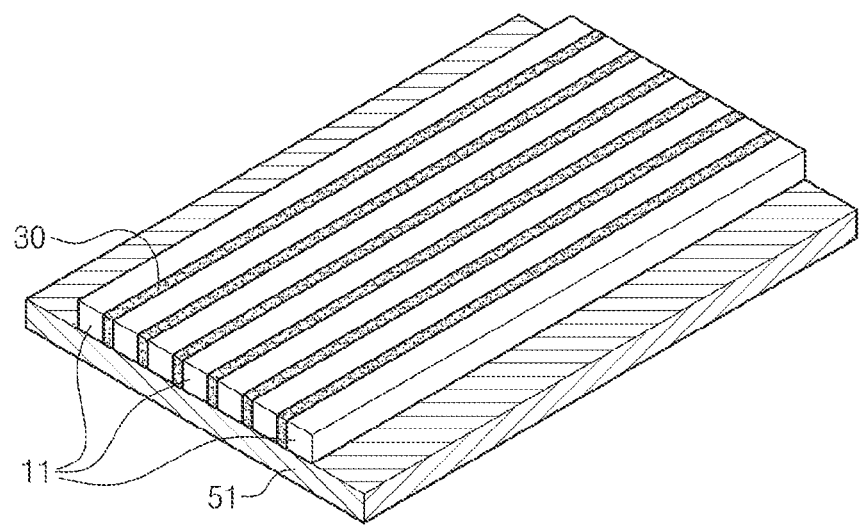
Figure 2F:
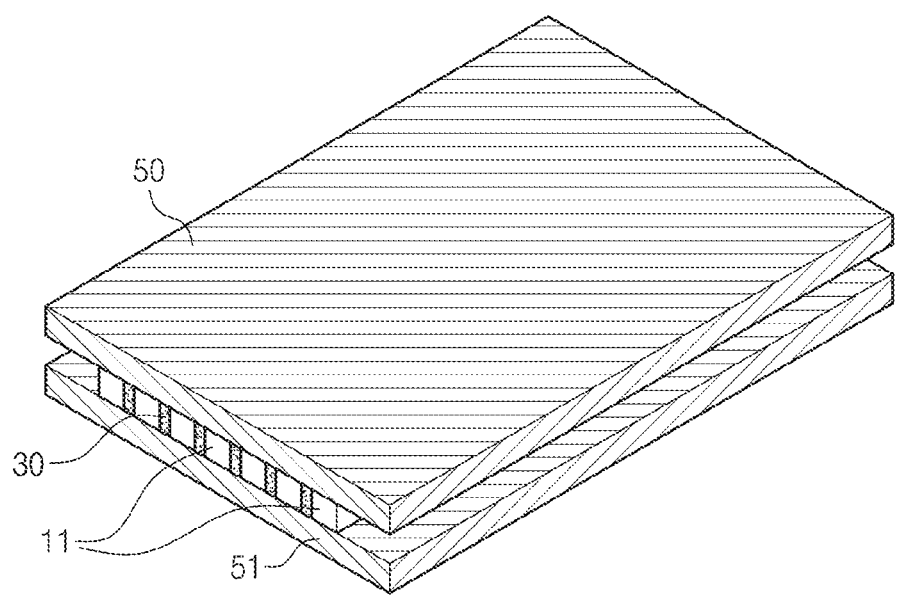

Referring to FIGS. 2E and 2F, the piezoelectric layer on the sacrificial substrate 20 is moved on a prepared lower flexible electrode substrate 51. An upper flexible electrode substrate 50 is formed on the piezoelectric layer disposed on the lower flexible electrode substrate 51.

The upper and lower flexible electrode substrates 50 and 51 may include a conductive material such as aluminum (Al), copper (Cu), silver (Ag), and/or gold (Au). In other words, each of the upper and lower flexible electrode substrates 50 and 51 may be a flexible metal substrate. Alternatively, each of the upper and lower flexible electrode substrates 50 and 51 may consist of an insulating polymer layer and a flexible metal sheet disposed on one surface of the insulating polymer layer. An epoxy or a conductive film having adhesive property may be disposed between the metal sheet and the one surface of the insulating polymer layer. In other words, the metal sheet may be bonded to the one surface of the insulating polymer layer by the epoxy or conductive film having the adhesive property. In still another embodiment, each of the upper and lower flexible electrode substrates 50 and 51 may consist of the insulating polymer layer, and an electrode layer formed on the insulating polymer layer by a screen printing method using a silver paste. In this case, the electrode layer has a thickness capable of providing the flexibility to the electrode layer.

The upper and lower flexible electrode substrates 50 and 51 may be in direct contact with the piezoelectric layer. In other words, the upper and lower flexible electrode substrates 50 and 51 may be in direct contact with the first and second piezoelectric lines 11 and 30. Here, each of the first and second piezoelectric lines 11 and 30 may have the quadrilateral cross section in the extending direction of the first and second piezoelectric lines 11 and 30. Thus, electrical contact between the piezoelectric layer and the upper and lower flexible electrode substrates 50 and 51 may be improved to increase the piezoelectric charge coefficient of the flexible piezoelectric energy harvesting device.

A predetermined voltage may be applied to the upper and lower flexible electrode substrates 50 and 51, such that polarization may generate in the upper and lower flexible electrode substrates 50 and 51. Thus, the flexible piezoelectric energy harvesting device may be fabricated.

As a result, the flexible piezoelectric energy harvesting device fabricated by the aforementioned method includes the piezoelectric layer consisting of the first and second piezoelectric lines 11 and 30 having the quadrilateral cross section in the extending direction of the first and second piezoelectric lines 11 and 30. Thus, the flexible piezoelectric energy harvesting device may have high flexibility and the improved piezoelectric charge coefficient. As a result, it is possible to provide the method of fabricating the flexible piezoelectric energy harvesting device capable of greatly improving the amount of obtained electrical energy.

Figure 3:
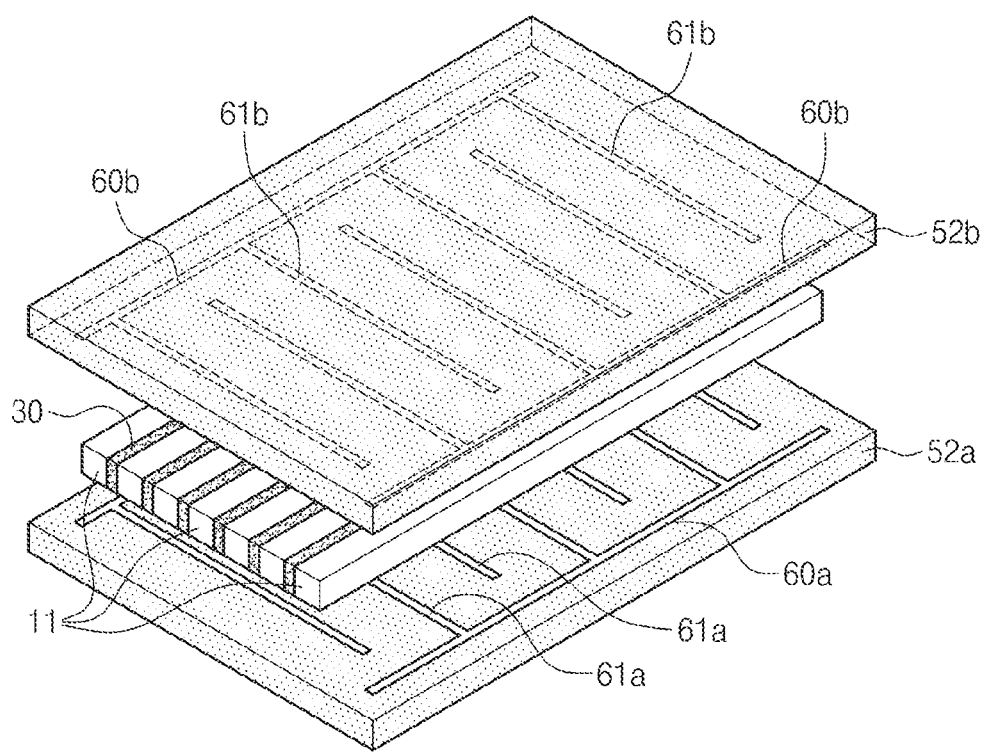
FIGS. 3 and 4 are perspective views illustrating flexible piezoelectric energy harvesting devices according to other embodiments of the inventive concept.
Figure 4:
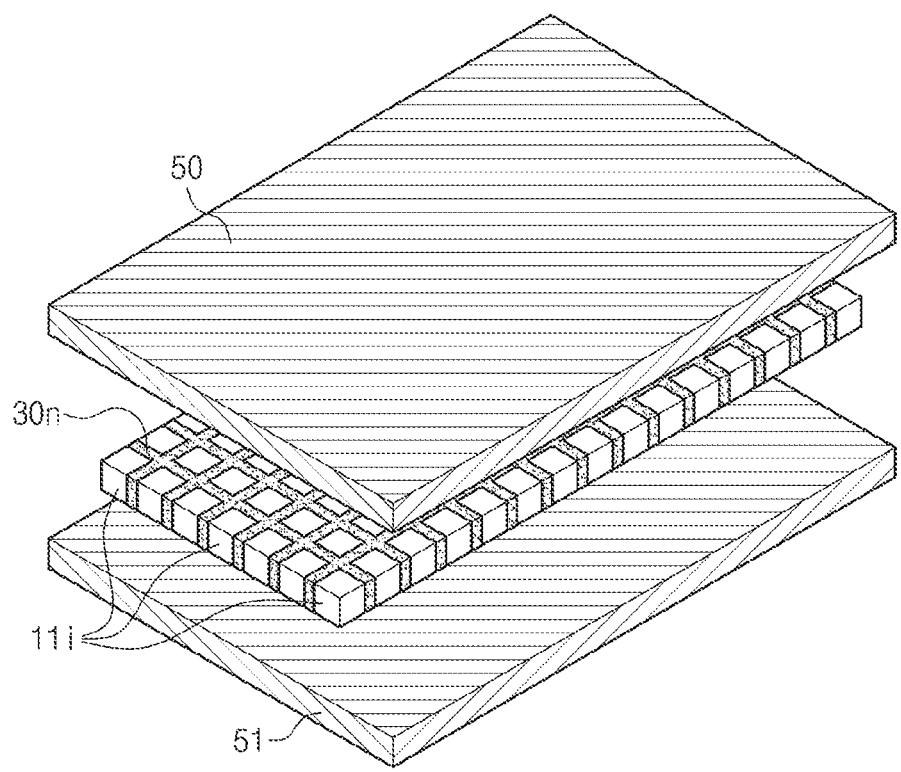

Hereinafter, flexible piezoelectric energy harvesting devices according to other embodiments will be described with reference to FIGS. 3 and 4. FIGS. 3 and 4 are perspective views illustrating flexible piezoelectric energy harvesting devices according to other embodiments of the inventive concept. In the present embodiments, the same elements as described in the above embodiments will be indicated by the same reference numerals and the same reference designators. The descriptions to the same elements as in the aforementioned embodiments will be omitted or mentioned briefly.

A flexible piezoelectric energy harvesting device in FIG. 3 may include lower and upper flexible electrode substrates having different structures from those of the flexible electrode substrates 51 and 50 of the flexible piezoelectric energy harvesting device according to the aforementioned embodiment.

Referring to FIG. 3, each of the lower and upper flexible electrode substrates may include an insulating polymer layer 52a or 52b and an electrode pattern disposed on one surface of the insulating polymer layer 52a or 52b which is adjacent to the piezoelectric layer. The insulating polymer layer 52a or 52b may include polyimide. The electrode pattern may have an interdigitated electrode (IDE) structure. The IDE structure may consist of body portions 60a or 60b opposite to each other and tooth portions 61a or 61b extending from the body portions 60a or 60b and being alternately arranged.

The flexible piezoelectric energy harvesting device including the electrode patterns of the IDE structures uses a great piezoelectric charge coefficient ($d_{33}$) of the first piezoelectric lines 11 of the piezoelectric layer, such that the amount of the generated electrical energy may be improved.

A metal sheet having a thickness capable of providing the flexibility thereto may be formed on a surface of the insulating polymer layer 52a or 52b, and then the metal sheet may be patterned using a photolithography process to form the electrode pattern having the IDE structure. The electrode pattern having the IDE structure may be formed to have the thickness capable of providing the flexibility to the electrode pattern by performing an electron-beam deposition process on the surface of the insulating polymer layer 52a or 52b. In another embodiment, the electrode pattern having the IDE structure may be separately formed to have the thickness capable of providing the flexibility to the electrode pattern and then may be bonded to the surface of the insulating polymer layer 52a or 52b. In this case, an epoxy or a conductive film having an adhesive property may be formed between the electrode pattern and the surface of the insulating polymer layer 52a or 52b. In still another embodiment, the electrode pattern having the IDE structure may be formed to have the thickness capable of providing the flexibility to the electrode pattern by performing a screen printing method using a silver paste on the surface of the insulating polymer layer 52a or 52b.

A flexible piezoelectric energy harvesting device in FIG. 4 has a piezoelectric layer of a different structure from the piezoelectric layer of the flexible piezoelectric energy harvesting devices according to the embodiments described above.

Referring to FIG. 4, a piezoelectric layer may include first piezoelectric islands 11i spaced apart from each other and regularly arranged, and a second piezoelectric net pattern 30n filling spaces between the first piezoelectric islands 11i.

Each of the first piezoelectric islands 11i may have quadrilateral cross section in one direction, and the second piezoelectric net pattern 30n may fill the spaces between the first piezoelectric islands 11i. Thus, the electrical contact between the piezoelectric layer and the upper and low flexible electrode substrates 50 and 51 may be improved to improve the piezoelectric charge coefficient of the flexible piezoelectric energy harvesting device.

The first piezoelectric islands 11i may include a piezoelectric ceramic material or a single-crystalline material. The piezoelectric ceramic material may include lead zirconate titanate (PZT) or lead-free ceramic materials. The single-crystalline material may include lead magnesium niobate-lead titanate (PMN-PT), lead magnesium niobate-lead zirconate titanate (PMN-PZT), lead indium niobate-lead titanate (PIN-PT), or lead zirconate niobate-lead titanate (PZN-PT).

The second piezoelectric net pattern 30n may include a piezoelectric polymer material. The piezoelectric polymer material may include a polyvinylidene difluoride (PVDF) polymer-based piezoelectric material, or a polyvinylidene difluoride-trifluoroethylene (PVDF-TrFE) polymer-based piezoelectric material.

After the first piezoelectric lines 11 of FIG. 2B are formed, the first piezoelectric lines 11 may be additionally patterned in a direction crossing the extending direction of the first piezoelectric lines 11 to form the first piezoelectric islands 11i.

Similarly to the process of filling the slits 12 of FIG. 2C, the liquid piezoelectric polymer material 30 of FIG. 2C may fill the spaces between the first piezoelectric islands 11i to form the second piezoelectric net pattern 30n.

As described above, the flexible piezoelectric energy harvesting devices according to embodiments include the piezoelectric layer consisting of the first piezoelectric lines or islands of the piezoelectric ceramic material or the single-crystalline material and the second piezoelectric lines or net pattern of the piezoelectric polymer material. Thus, the flexible piezoelectric energy harvesting devices may have the flexibility but may not be easily broken. As a result, the flexible piezoelectric energy harvesting devices may be easily applied to objects having predetermined shapes such as the human body and/or clothes, and the amount of the electrical energy obtained by the flexible piezoelectric energy harvesting devices may be improved. The flexible piezoelectric energy harvesting devices may be used along with a flexible solar energy harvesting device, a flexible thermoelectric energy harvesting device, and/or a flexible battery. Thus, the flexible piezoelectric energy harvesting devices may be applied to various multi-energy sources.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of fabricating a flexible piezoelectric energy harvesting device, the method comprising:
    forming a piezoelectric layer, including forming a plurality of first piezoelectric lines spaced apart from each other in one direction and forming a plurality of second piezoelectric lines respectively filling spaces between the first piezoelectric lines; then
    placing the piezoelectric layer on a first flexible electrode substrate to come in direct contact with the first flexible electrode substrate; and
    forming a second flexible electrode substrate on the piezoelectric layer.

2. The method of claim 1, wherein the first and second flexible electrode substrates include a conductive material.

3. The method of claim 1, wherein each of the first and second flexible electrode substrates comprises:
    an insulating polymer layer; and
    an electrode pattern disposed on a surface of the insulating polymer layer which is adjacent to the piezoelectric layer.

4. The method of claim 3, wherein the electrode pattern of each of the first and second flexible electrode substrates has an interdigitated electrode (IDE) structure.

5. The method of claim 1, wherein forming the piezoelectric layer comprises:
    forming a first piezoelectric layer on a sacrificial substrate;
    patterning the first piezoelectric layer to form the first piezoelectric lines spaced apart from each other in the one direction;
    forming the second piezoelectric lines filling the spaces between the first piezoelectric lines, respectively; and then
    moving the first piezoelectric layer including the first and second piezoelectric lines disposed on the sacrificial substrate onto the first flexible electrode substrate.

6. The method of claim 5, wherein the first piezoelectric layer is formed of a piezoelectric ceramic material or a single-crystalline material.

7. The method of claim 6, wherein the piezoelectric ceramic material includes lead zirconate titanate (PZT) or lead-free ceramic materials.

8. The method of claim 6, wherein the single-crystalline material includes lead magnesium niobate-lead titanate (PMN-PT), lead magnesium niobate-lead zirconate titanate (PMN-PZT), lead indium niobate-lead titanate (PIN-PT), or lead zirconate niobate-lead titanate (PZN-PT).

9. The method of claim 5, wherein each of the first piezoelectric lines is formed to have a quadrilateral cross section in another direction crossing the one direction.

10. The method of claim 5, wherein the second piezoelectric lines are formed of a piezoelectric polymer material; and
    wherein the piezoelectric polymer material includes a polyvinylidene difluoride (PVDF) polymer-based piezoelectric material, or a polyvinylidene difluoride-trifluoroethylene (PVDF-TrFE) polymer-based piezoelectric material.

11. The method of claim 1, wherein the second flexible electrode substrate is formed as a metal substrate, and the piezoelectric layer is placed on the second flexible electrode substrate such that an entire bottom surface of the piezoelectric layer is covered by and in contact with the metal substrate.

12. The method of claim 1, wherein the second flexible electrode substrate includes a metal sheet, and the piezoelectric layer is placed on the second flexible electrode substrate such that an entire bottom surface of the piezoelectric layer is covered by and in contact with the metal sheet.

13. The method of claim 1, wherein the first flexible electrode substrate is formed as a metal substrate, and the first flexible electrode substrate is formed on the piezoelectric layer such that the metal substrate covers and contacts an entire top surface of the piezoelectric layer.

14. The method of claim 1, wherein the first flexible electrode substrate includes a metal sheet, and the first flexible electrode substrate is formed on the piezoelectric layer such that the metal sheet covers and contacts an entire top surface of the piezoelectric layer.

* * * * *